United States Patent
She et al.

(10) Patent No.: US 10,910,347 B2
(45) Date of Patent: Feb. 2, 2021

(54) METHOD, APPARATUS AND SYSTEM TO INTERCONNECT PACKAGED INTEGRATED CIRCUIT DIES

(71) Applicant: Intel Corporation, Santa Clara, CA (US)

(72) Inventors: Yong She, Songjiang (CN); John G. Meyers, Sacramento, CA (US); Zhicheng Ding, Shanghai (CN); Richard Patten, Langquaid (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/516,695

(22) Filed: Jul. 19, 2019

(65) Prior Publication Data
US 2019/0341372 A1 Nov. 7, 2019

Related U.S. Application Data

(63) Continuation of application No. 15/749,760, filed as application No. PCT/CN2015/090716 on Sep. 25, 2015, now Pat. No. 10,396,055.

(51) Int. Cl.
*H01L 25/065* (2006.01)
*H01L 23/488* (2006.01)
(Continued)

(52) U.S. Cl.
CPC ........ *H01L 25/0657* (2013.01); *H01L 23/488* (2013.01); *H01L 23/49* (2013.01);
(Continued)

(58) Field of Classification Search
CPC ... H01L 25/0657; H01L 25/50; H01L 23/488; H01L 23/49; H01L 23/50; H01L 23/5389;
(Continued)

(56) References Cited

U.S. PATENT DOCUMENTS

2004/0012079 A1 1/2004 Khiang
2005/0199995 A1* 9/2005 Nomoto .................. H01L 23/12
257/692
(Continued)

FOREIGN PATENT DOCUMENTS

CN 101174614 5/2008
CN 101452860 6/2009
(Continued)

OTHER PUBLICATIONS

Office Action from Taiwan Patent Application No. 105127012 dated Dec. 18, 2020, 4 pages.
(Continued)

*Primary Examiner* — Tu-Tu V Ho
(74) *Attorney, Agent, or Firm* — Schwabe, Williamson & Wyatt, P.C.

(57) ABSTRACT

Techniques and mechanisms for interconnecting stacked integrated circuit (IC) dies. In an embodiment, a first end of a wire is coupled to a first IC die of a stack, where a second end of the wire is further anchored to the stack independent of the coupled first end. A package material is subsequently disposed around IC dies of the stack and a first portion of the wire that includes the first end. Two-point anchoring of the wire to the stack aids in providing mechanical support to resist movement that might otherwise displace and/or deform the wire while the package material is deposited. In another embodiment, the first portion of the wire is separated from the rest of the wire, and a redistribution layer is coupled to the first portion to enable interconnection between the first IC die and another IC die of the stack.

22 Claims, 11 Drawing Sheets

(51) Int. Cl.
*H01L 23/00* (2006.01)
*H01L 23/49* (2006.01)
*H01L 23/50* (2006.01)
*H01L 25/00* (2006.01)
*H01L 23/538* (2006.01)

(52) U.S. Cl.
CPC .............. *H01L 23/50* (2013.01); *H01L 24/09* (2013.01); *H01L 24/19* (2013.01); *H01L 24/20* (2013.01); *H01L 24/33* (2013.01); *H01L 24/49* (2013.01); *H01L 24/73* (2013.01); *H01L 24/85* (2013.01); *H01L 24/96* (2013.01); *H01L 25/50* (2013.01); *H01L 23/5389* (2013.01); *H01L 24/32* (2013.01); *H01L 24/92* (2013.01); *H01L 2224/0231* (2013.01); *H01L 2224/12105* (2013.01); *H01L 2224/214* (2013.01); *H01L 2224/32145* (2013.01); *H01L 2224/32225* (2013.01); *H01L 2224/32245* (2013.01); *H01L 2224/48249* (2013.01); *H01L 2224/73215* (2013.01); *H01L 2224/73217* (2013.01); *H01L 2224/73267* (2013.01); *H01L 2224/83007* (2013.01); *H01L 2224/92174* (2013.01); *H01L 2224/92244* (2013.01); *H01L 2225/0651* (2013.01); *H01L 2924/00014* (2013.01); *H01L 2924/14* (2013.01); *H01L 2924/181* (2013.01); *H01L 2924/18162* (2013.01)

(58) Field of Classification Search
CPC ......... H01L 24/09; H01L 24/19; H01L 24/20; H01L 24/32; H01L 24/33; H01L 24/49; H01L 24/73; H01L 24/85; H01L 24/92; H01L 24/96; H01L 2224/0231; H01L 2224/12105; H01L 2224/214; H01L 2224/32145; H01L 2224/3225; H01L 2224/32245; H01L 2224/48249; H01L 2224/73215; H01L 2224/73217; H01L 2224/73267; H01L 2224/83007; H01L 2224/92174; H01L 2224/92244; H01L 2225/0651; H01L 2924/00014; H01L 2924/14; H01L 2924/181; H01L 2924/18162
USPC .......................................................... 257/777
See application file for complete search history.

(56) References Cited

U.S. PATENT DOCUMENTS

| | | |
|---|---|---|
| 2010/0193930 A1 | 8/2010 | Lee et al. |
| 2011/0037158 A1 | 2/2011 | Youn |
| 2014/0097475 A1* | 4/2014 | Jung ................. H01L 23/49827 257/211 |
| 2015/0123288 A1 | 5/2015 | Lee et al. |
| 2015/0200162 A1* | 7/2015 | Constantino ...... H01L 23/49537 257/532 |
| 2015/0221586 A1* | 8/2015 | Paek ....................... H01L 24/81 257/668 |
| 2016/0315071 A1 | 10/2016 | Zhai |

FOREIGN PATENT DOCUMENTS

| | | |
|---|---|---|
| CN | 101866915 | 10/2010 |
| TW | 201347139 | 11/2013 |
| TW | 201428926 A | 7/2014 |
| TW | I467731 | 1/2015 |

OTHER PUBLICATIONS

International Search Report and Written Opinion for International Patent Application No. PCT/CN2015/090716 dated Jul. 4, 2016, 12 pgs.
International Preliminary Search Report for PCT/CN2015/080716 dated Apr. 5, 2018, 7 pages.
Notice of Allowance from Taiwan Patent Application No. 105127012, dated Aug. 5, 2020, 3 pages, with English translation.

* cited by examiner

METHOD, APPARATUS AND SYSTEM TO INTERCONNECT PACKAGED INTEGRATED CIRCUIT DIES

CROSS-REFERENCE TO RELATED APPLICATION

This patent application is a continuation of U.S. patent application Ser. No. 15/749,760, filed Feb. 1, 2018, which is a U.S. National Phase Application under 35 U.S.C. § 371 of International Application No. PCT/CN2015/090716, filed Sep. 25, 2015, entitled "METHOD, APPARATUS AND SYSTEM TO INTERCONNECT PACKAGED INTEGRATED CIRCUIT DIES," which designates the United States of America, the entire disclosure of which are hereby incorporated by reference in their entirety and for all purposes.

BACKGROUND

1. Technical Field

Embodiments described herein generally relate to stacked die packages, and more particularly, but not exclusively, to processing for interconnecting stacked dies of a package.

2. Background Art

Mobile products (e.g., mobile phones, smart phones, tablet computers, etc.) are very restricted in available space because there are typically severe limitations for chip/package area and height (among other physical and electrical parameters). Therefore, it is extremely important to reduce the size of electronic components (e.g., packaged chips or discrete devices, integrated passive devices (IPDs), surface mount devices (SMDs), etc.) on a system board (e.g., printed circuit board PCB).

Conventional stacked electronic components typically require relatively large z-height, making them more difficult to fit inside a housing of mobile products, especially when several chips, IPDs or SMDs need to be assembled and/or stacked one on top of another. In addition, as with most electronic components, there is usually the goal of increased electrical performance.

There are two existing packaging methods for high die count stacked die packages. One method forms a wire bond based package in which substrate and over mold add extra z-height to the package. In addition, wire bond based package are also typically limited in their performance because of the number and length of the wires that are utilized in the packages.

Another existing packaging method for high die count stacked die packages utilizes Thru Silicon Via (TSV) technology. High die count stacked die packages that utilize TSV usually have relatively high speed. However, z-height reduction is still difficult with TSV. In addition, the vias that are formed using TSV technology often use up valuable space on silicon. There are also usually relatively high manufacturing costs that are associated with utilizing TSV technology, making it more expensive to produce high die count stacked die packages using TSV technology. The typical z-height of a conventional 16 Die BGA stacked die package is 1.35 mm where each die is thinned to 35 um.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
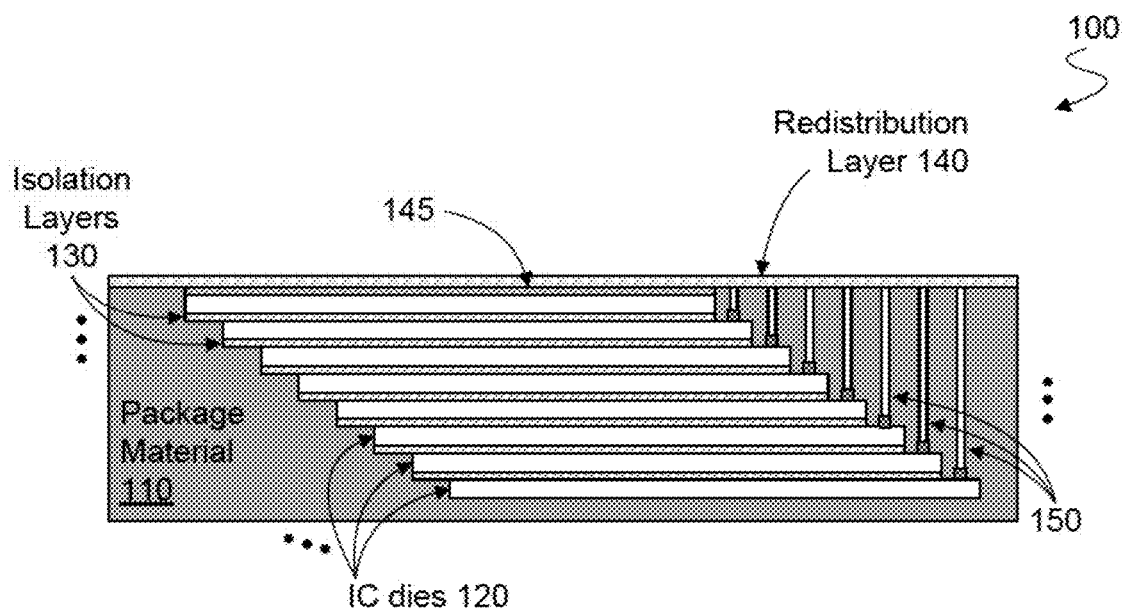
FIG. 1 is a cross-sectional diagram illustrating elements of a packaged device including interconnect structures according to an embodiment.
Figure 1:
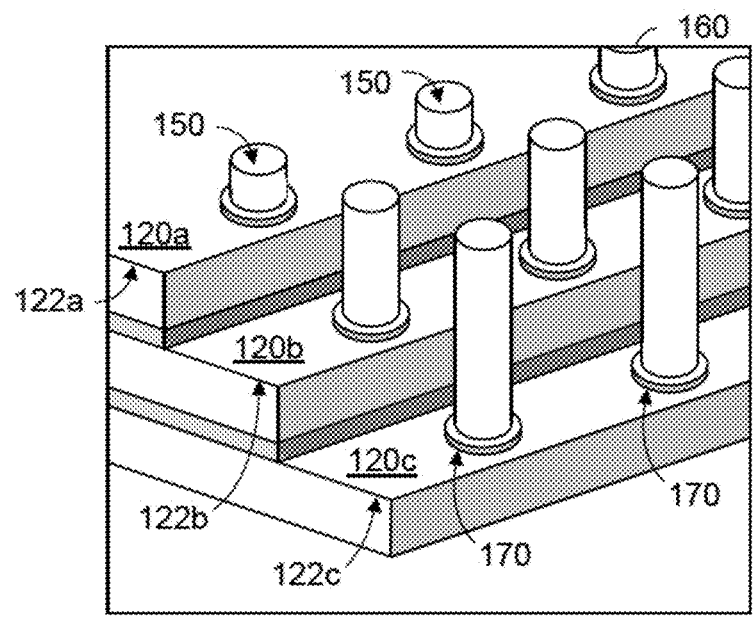

Embodiments discussed herein variously include techniques and/or mechanisms to provide interconnection between integrated circuit (IC) dies of a packaged device. The electronic assemblies, packages and methods described herein may address the drawbacks that are associated with using wire bond packaging technology and TSV technology to form high die count stacked die packages. In addition, electronic assemblies, packages and methods described herein may increase the electrical performance of high die count stacked die packages.

The electronic assemblies, packages and methods described herein may provide some benefits over using conventional TSV technology to form high die count stacked die packages. For example, the silicon utilization efficiency of the electronic assemblies, packages and methods described herein may be higher than TSV technology because TSV technology must fabricate the vias through peripheral areas of silicon. This need to fabricate openings in the silicon to create openings for via formation (i) uses valuable space on the silicon; and (ii) increases the fabrication costs associated with forming high die count stacked die packages. The electronic assemblies, packages and methods described herein may not require fabrication to create openings in the silicon for vias. Alternatively or in addition, the electronic assemblies, packages and methods described herein may utilize existing wire bond equipment to couple wires to an upper surface of a die. This ability to potentially use existing wire bond equipment may reduce the costs that are associated with fabricating the electronic assemblies, packages and methods described herein.

The electronic assemblies, packages and methods described herein may provide some benefits over using conventional substrate based wire bond technology. For example, the electronic assemblies, packages and methods described herein may provide improved electrical performance. The electrical performance may be better because the wires are shorter than the wires that are used in conventional wire bond technology. Alternatively or in addition, package z-height can be reduced significantly because (i) the extra over molding clearance that is usually required for over molding process in conventional wire bonding package technology may be eliminated (ii) traditional 130 um substrate is replaced by 25 um RDL layer. In some embodiments, thermal performance of a device may be improved because a top side (non-circuit side) of a top most die in a stack is exposed. This may aid in heat transfer from the packaged device to a surrounding environment—e.g., allowing a heat sink, heat spreader, fan or other cooling mechanism to be attached to the die, and/or allowing the die to be thermally connected to a case or chassis of a phone, computer, server or other device including the die.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including one or more packaged IC devices.

FIG. 1 is a cross-sectional side view of a device 100 that provides interconnection between integrated circuit (IC) dies according to an embodiment. Device 100 may be any of a variety of packaged IC devices such as one including, for example, packaged processor circuitry, memory, controller logic, a system-in-package (SIP) and/or the like.

The device 100 shown in FIG. 1 includes a stack comprising overlapping IC dies 120—e.g., where some or all IC dies 120 each has an upper surface coupled to a respective portion of wire (or "wire portion") that is to aid in connection to another such IC die 120. By way of illustration and not limitation, a plurality of wire portions 150 may each extend from an upper surface of a respective one of IC dies 120—e.g., where the portion is not overlapped by any other one of IC dies 120. The wire portions 150 may variously extend each through a package material 110 of device 100 to a redistribution layer 140 that is disposed on a side of package material 110. As discussed herein, processing to fabricate device 100 according to an embodiment may result in a residual material 145 being disposed between redistribution layer 140 and a closest one of IC dies 120.

Redistribution layer 140 may have disposed therein one or more traces, vias and/or other conductive structures to provide for interconnection between different ones of wire portions 150 (and thus, interconnection between different ones of IC dies 120. In some embodiments, the stack further comprises isolation layers 130 including, for example, a dielectric material to aid in providing some electrical isolation between respective circuitry in or on different ones of the IC die 120. The number and configuration of IC dies 120 (and of isolation layers 130) is merely illustrative, and not limiting on certain embodiments.

The stack including overlapping IC dies 120 may be arranged in an overlapping configuration to enable connection of the plurality of wire portions 150 each to a respective one of the IC dies 120 at a point that is not covered by another of the IC dies 120. In the example embodiment illustrated in detail view 160, stacked IC dies 120a, 120b, 120c (e.g., of IC dies 120) include respective sides 122a, 122b, 122c having conductive pads 170 variously disposed thereon, where the conductive pads 170 on one of IC dies 120a, 120b, 120c are not overlapped by another of IC dies 120a, 120b, 120c. Wire portions 150 may variously couple to and extend each from a respective one of conductive pads 170. The wire portions 150 may variously extend from sides 122a, 122b, 122c through a package material (not shown in detail view 160 to avoid obscuring certain features of some embodiments) such as package material 110.

It should be noted that the conductive pads 170 shown in detail view 160 are merely one example of a conductive structure that may be disposed in or on an upper surface of an IC die for engagement with a wire portion. In some embodiments, an end of a wire portion 150 may include a spherical section or other structure (not shown) that is relatively wide to improve electrical connection to conductive pad 170—e.g., where a relatively narrow cylindrical or otherwise columnar section of that same wire portion 150 extends from the spherical section. It should be noted that other forms are contemplated for a wire portion 150. The configuration and size of wire portions 150 may depend on the overall design of an IC die 120, manufacturing considerations that are associated with fabricating the wire portions 150 and/or other factors.

As shown in detail view 160, a plurality of wire portions 150 may extend from one of the upper surfaces 122a, 122b, 122c through the package material—e.g., wherein only the packaged material extends around (and in an embodiment, adjacent to) a periphery of each such wire portion 150. In the example IC dies 120a, 120b, 120c that are shown in detail view 160, the plurality of wire portions 150 are variously aligned in rows each near an edge of a respective one of IC dies 120a, 120b, 120c.

It should be noted that the plurality of wire portions 150 may be arranged in any of a variety of manners on the upper surface of an IC die. As examples, the plurality of wire portions 150 may be arranged in an L-shaped, C-shaped, or multiple row configuration on the upper surfaces 122a, 122b, 122c of the IC dies 120a, 120b, 120c. The arrangement of the plurality of wire portions 150 on the upper surfaces 122a, 122b, 122c of the IC dies 120a, 120b, 120c will depend in part on the overall design of the IC die 120 as well as manufacturing consideration that are associated with fabricating the IC die 120 (among other factors).

Figure 2:
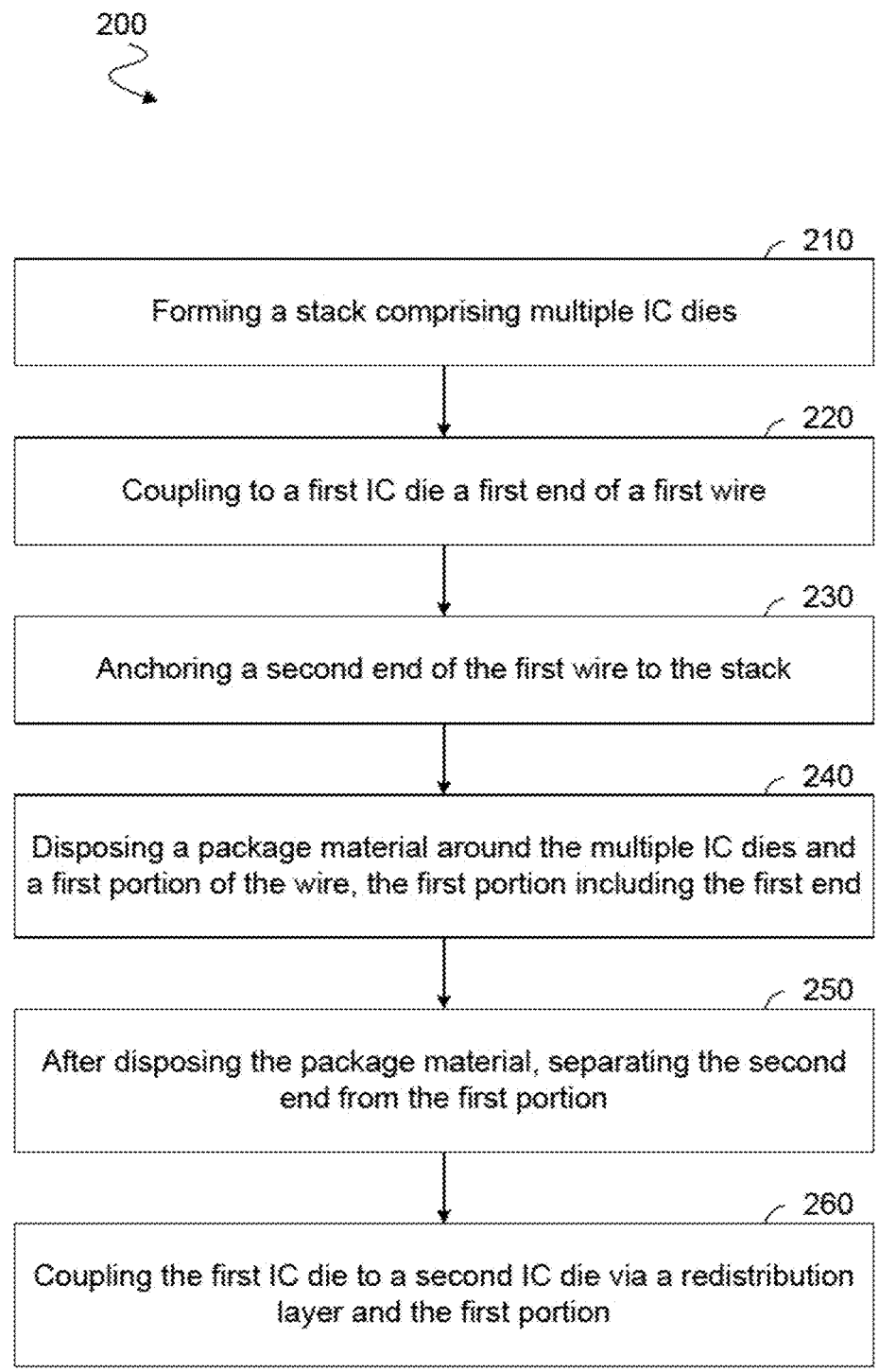
FIG. 2 is a flow diagram illustrating elements of a method for fabricating interconnect structures of a packaged device according to an embodiment.

FIG. 2 is a flow diagram illustrating an example method 200 for fabricating a package IC device according to an embodiment. The method 200 may provide a device having some of all of the features of device 100, for example.

Method 200 may include, at 210, forming a stack comprising multiple IC dies. The forming at 210 may include operations adapted from conventional die stacking techniques, which are not detailed herein to avoid obscuring certain features of various embodiments. The stack formed at 210 may have an arrangement such as that of IC dies 120, for example. Certain embodiments are not limited with respect to the particular number of IC dies. Different embodiments include any of a variety of staggered IC die stacking configurations that enable interconnection with structures having features described herein. The stack may further comprise one or more structures to aid in the formation of wire portions in a package that is to include the multiple IC dies. For example, the one or more structures may include a layer (referred to herein as a "dummy layer") comprising an aluminum-coated silicon wafer or some other suitable dummy material—e.g., where the material will be at least partially removed during operation 200 and, in some embodiments, does not itself aid in exchanges between IC dies during operation of a device fabricated by method 200.

In an embodiment, method 200 further comprises, at 220, coupling a first end of a first wire to a first IC die of the multiple IC dies. The coupling at 220 may include soldering or otherwise providing a conductive connection between the first end and connector hardware (e.g., a pad, ball or other structure) disposed in or on a surface of the first IC die. Method 200 may further include, at 230, anchoring a second end of the first wire to the stack. For example, the first wire may comprise the second end and a first portion including the first end—e.g., where the first portion is to be distinguished from the second end. The anchoring at 230 may include performing soldering, adhering and/or other coupling to provide an additional, rigid connection to the stack at a point of the wire, such as the second end, other than a point of the first portion. In one embodiment, the anchoring at 230 includes coupling the second end to a pad or other conductive contact on another IC die of the multiple IC dies. In another embodiment, the anchoring at 230 includes affixing the second end (or some other point of the wire other than a point of the first portion) to a structure of the stack other than any of the multiple IC dies. For example, the second end may be coupled to a dummy layer of the stack—e.g., where the dummy layer is adhered directly or indirectly to the multiple IC dies.

In an embodiment, method 200 further comprises, at 240, disposing a package material around the multiple IC dies and the first portion. The package material may include any of a variety of materials known in the art for packaging integrated circuitry. Examples of such materials include, but are not limited to, an epoxy, polymer, resin, plastic, ceramic etc. The disposing at 240 may be performed while the first end is coupled to the first IC die and the second end is anchored to the stack. The disposing at 240 may include disposing an epoxy or other such package material at least around a periphery of the multiple IC dies. For example, the disposing at 240 may further comprise disposing package material under a lowermost die surface of the multiple IC dies and/or over an uppermost die surface of the multiple IC dies. In some embodiments, the package material is further disposed at 240 around respective portions of each of a plurality of wires (including the first wire) that are variously coupled to the IC die stack. During the disposing at 240, the first portion may be straight and, in some embodiments, may extend through the package material in a direction that is substantially normal (e.g., ±5°) to the upper surface of the first IC die. The package material may be at least partially cured or otherwise hardened after the disposing at 240. In one embodiment, at least some of the first wire—e.g., a portion other than the first portion—extends out of the package material after the disposing at 240.

Method 200 may further comprise, at 250, separating the second end from the first portion after the disposing at 240. For example, any of a variety of cutting, grinding, polishing, plasma etching and/or other such material removal operations may be performed at 250 to remove at least some of the first wire from the first portion—e.g., including exposing another end of the first portion. In an embodiment, the separating at 250 includes topside grinding or other such processing to thin or otherwise remove some of the package material disposed at 240 and expose a first surface of the package material. Such grinding or other removal processing may also cut or otherwise remove material of one or more wires, including the first wire, to expose respective ends of one or more wire portions that are disposed in the remaining package material. The first surface may extend in a plane that also includes the exposed other surface of the first portion. A surface of another material (other than the package material) may also extend in the plane—e.g., wherein the package material is disposed between the first wire and the other material in the plane. The other material (e.g., including a residual adhesive and/or residual dummy material) may be an artifact of earlier operations of method 200—e.g., where package thinning processes do not extend through to expose a surface of an IC die.

In an embodiment, method 200 further comprises, at 260, coupling the first IC die to a second IC die of the multiple IC dies via a redistribution layer and the first portion. For example, the separating at 240 may include exposing a first surface of the package material, where the coupling at 260 includes disposing the redistribution layer on the first surface to interconnect respective ends of wire portions each extending in the package material to a respective IC die. Such disposing may include operations adapted from any of a variety of masking, plating and/or other such processing to form interconnects of a redistribution layer according to conventional techniques. The coupling at 260 may further comprise forming in or on the redistribution layer vias, traces and/or other structures to enable interconnection of the second IC die to the other end of the first portion—e.g., via a second wire that extends in the package material between the second IC die and the redistribution layer.

Figure 3A:
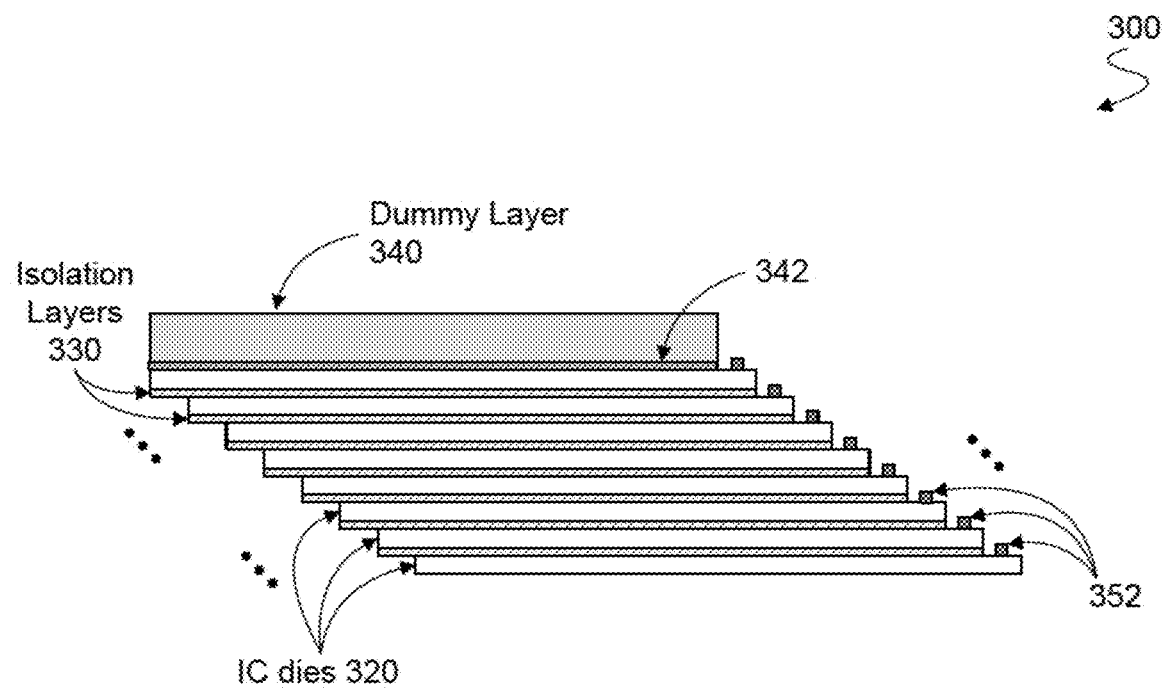
FIGS. 3A-3C show cross-sectional diagrams variously illustrating operations to fabricate interconnect structures of a packaged device according to an embodiment.
Figure 3A:
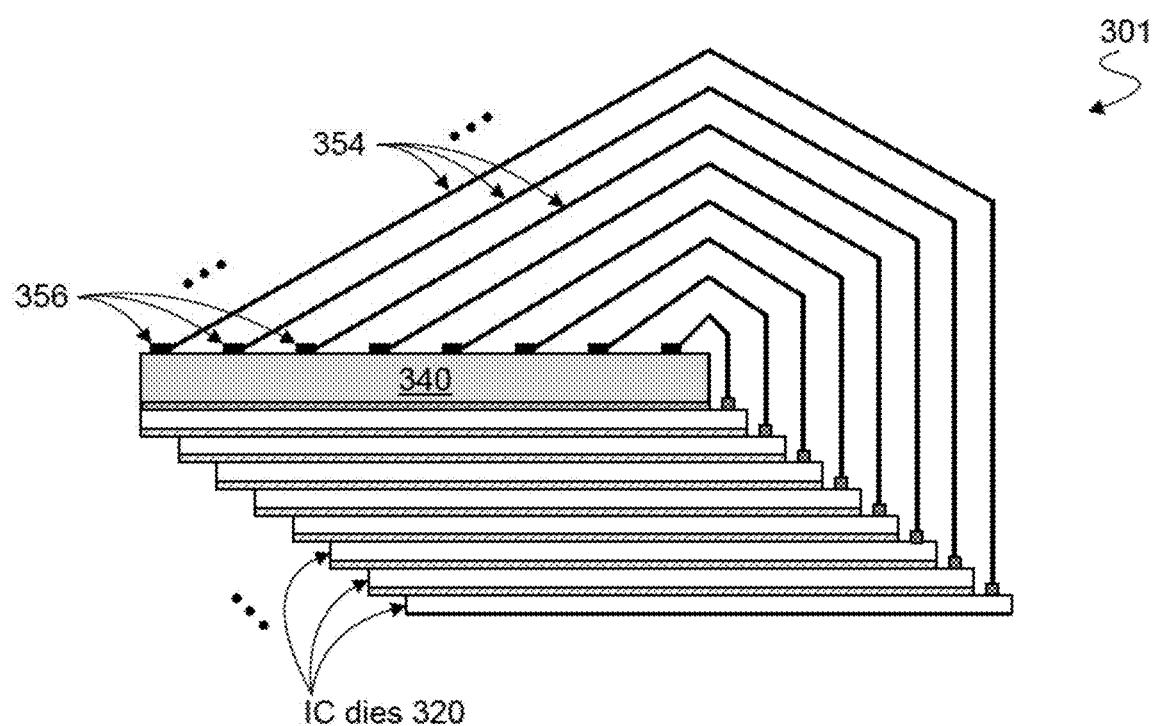
Figure 3B:
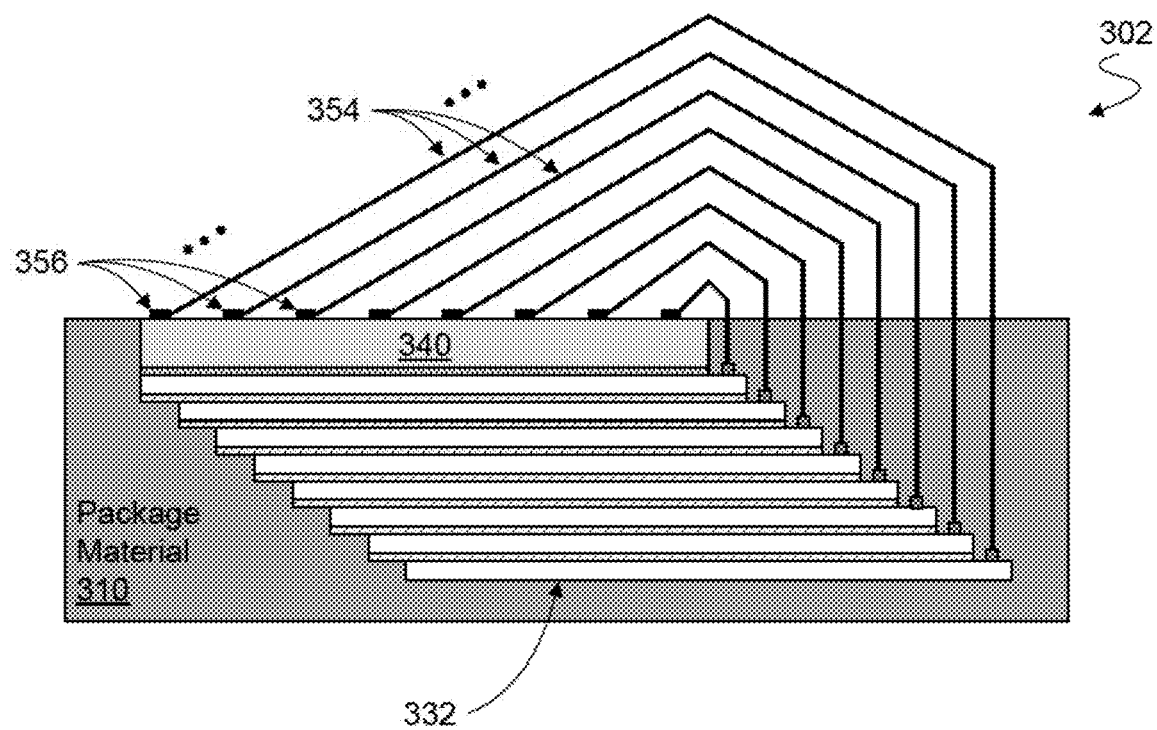
Figure 3B:
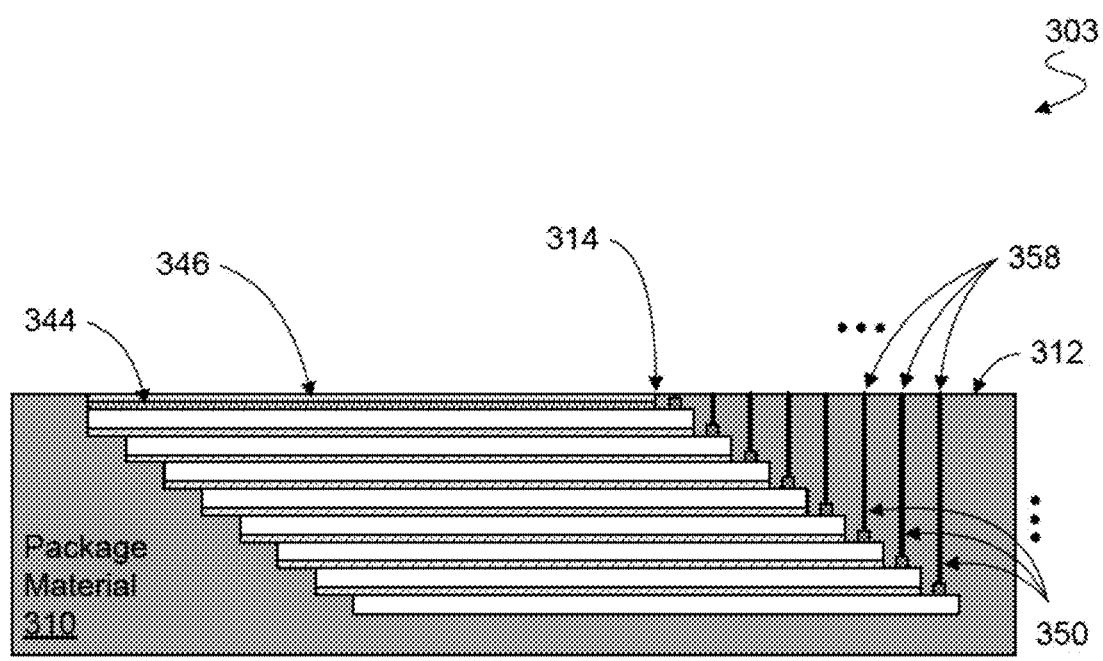
Figure 3C:
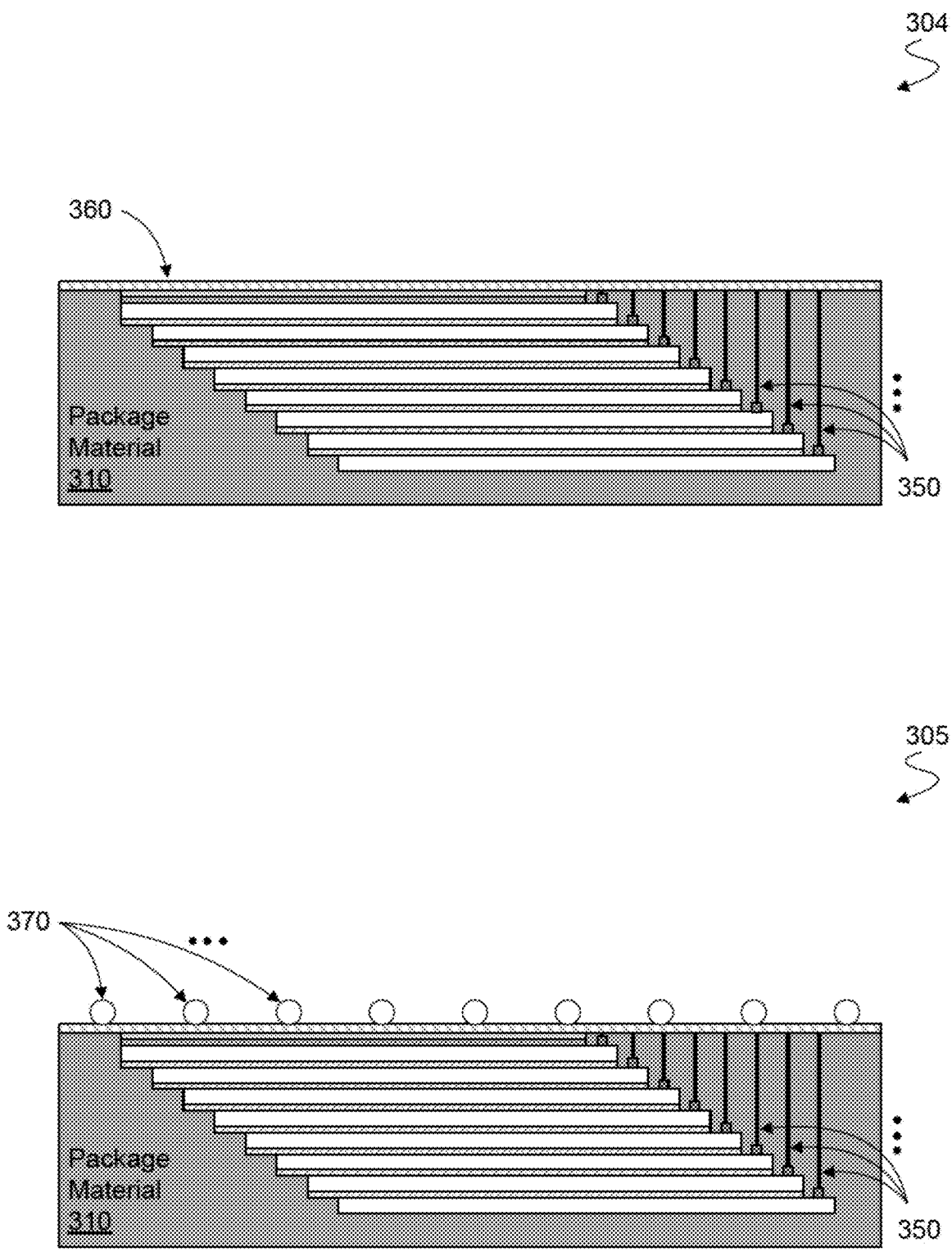

FIGS. 3A-3C show cross-sectional views illustrating respective stages 300-305 of processing to fabricate a packaged IC device according to an embodiment. Processing such as that shown in FIG. 3A-3C may include some or all of the features of method 200, for example. In one illustrative embodiment, such processing fabricates hardware having features of device 100.

At stage 300, a stack (e.g., formed by processing such as that at 210 of method 200) includes overlapping IC dies 320. In some embodiments, the stack further comprises isolation layers 330 variously disposed between respective ones of IC dies 320. Some or all IC dies 320 may be variously staggered or otherwise configured to provide exposed surface regions of such IC dies 320—e.g., where a surface region of one of IC dies 320 is not directly covered by another of IC dies 320. These exposed surface regions may have disposed therein or thereon interface hardware, such as the illustrative contact pads 352, to facilitate connection of wires each to a respective one of IC dies 320.

In one embodiment, the stack further includes a dummy layer 340 comprising aluminum and/or some other material suitable for providing an anchor point for some or all such wires. The dummy layer 342 may be coupled directly or indirectly to one of IC dies 320—e.g., via an adhesive 342 such as an electrically insulative epoxy or other such material. In one embodiment, the dummy layer 340 and/or the adhesive 342 does not extend over one or more of contacts 352. For example, dummy layer 340 and adhesive 342 may extend across only part of a surface of an IC die 320 that is closest to dummy layer 340.

At stage 301, a plurality of wires 354 may be variously coupled each to a respective one of IC dies 320 via a respective one of contacts 352. By way of illustration and not limitation, the wires 354 may each have respective first ends each coupled to a corresponding one of contacts 352. Wires 354 may additionally have respective second ends that are variously soldered, adhered or otherwise coupled to dummy layer 340—e.g., as represented by the illustrative anchor points 356. The wires 354 may be variously bent for coupling both to IC dies 320 and to dummy layer 340. For example, some or all of wires 354 may each include a rigid or semi-rigid metal that is preformed into any of a variety of curved, piecewise segmented and/or otherwise arched structures. Alternatively or in addition, some or all of wires 354 may be flexible at stage 301, where anchoring to dummy layer 340 provides at least some mechanical support to limit movement of such flexible wires during subsequent processing.

Such subsequent processing may include, at stage 302, a package material 310 being disposed at least around IC dies 320 and respective portions 350 of wires 354. The package material 310 may be injection molded or otherwise deposited to extend above IC dies 320 and, in some embodiments, contact adhesive 342 and/or dummy layer 340. In the illustrative embodiment shown, package material 310 extends around a periphery of the IC die stack, as well as both above and below the IC die stack. In other embodiments, the deposition of package material 310 may leave some portion of the IC die stack exposed—e.g., wherein a lowermost die surface 332 of the IC die stack (or an isolation material other than package material 310) is instead at or below the bottom side of package material 310. During depositing of package material 310, the anchoring of wires 354 to the stack (via points in addition to, and other than, contacts 352) may aid in providing mechanical support for portions 350 each to remain in a respective position. This mechanical support may resist movement that might otherwise displace and/or deform portions 350 while package material 310 flows around portions 350.

At stage 303, respective portions of wires 354 may be removed to separate portions 350 each from another respective portion of wires 354. By way of illustration and not limitation, cutting, grinding, polishing and/or other processing may be performed to remove portions of wires 354 that, for example, extend above package material 310. Alternatively or in addition, such processing may thin or otherwise remove some of package material 310 to expose a surface of package material 310 that extends in a plane 312 (seen edgewise in FIG. 3B). The exposed ends 358 of portions 350 may also be in plane 312, for example.

In one embodiment, processing to remove some of package material 310 and to expose ends 358 also removes at least some of dummy layer 340 and the wire ends coupled thereto (e.g., at anchor points 356). For example, such removal processing may result in plane 312 including an interface 312 between the exposed surface of package material 310 and an exposed surface of another material (or materials) disposed between the IC dies 320 and plane 312. In the illustrative embodiments shown, such other material (or materials) includes at least some residual amount 344 of adhesive 342 and/or some residual amount 346 of dummy layer 340. Within plane 312, the surface of packaged material 310 may be disposed between such residual material and at least some of ends 358. For example, package material 310 may adjoin the residual amount 344 of adhesive 342 and/or the residual amount 346 of dummy layer 340 at a location 314 on a surface of the device.

At stage 304, a redistribution layer 360 may be adhered or otherwise coupled to the exposed structures in plane 312—e.g., including coupling redistribution layer 360 to exposed ends 358 of portions 350. Such coupling of redistribution layer 360 may include operations adapted from conventional package fabrication techniques. After such coupling, redistribution layer 360 may interconnect various ones of ends 358 to one another, which in turn may provide for various interconnections between IC dies 320. The particular configuration of interconnect structures in redistribution layer 360 may depend in part on the locations of ends 358 in the overall design of the finally produced packaged device. Although certain embodiments are not limited in this regard, fabrication processing according to one embodiment may further comprise attaching other interface hardware that, for example, is to aid in coupling the packaged IC device to one or more other devices. By way of illustration and not limitation, at stage 305, solder bumps 370 may be placed on the conductive redistribution layer 360 or, in another embodiment, directly on the exposed ends 358. The configuration of solder bumps 370 may depend in part on the locations of the ends 358 in plane 312 and the configuration of the redistribution layer 360.

Figure 4A:
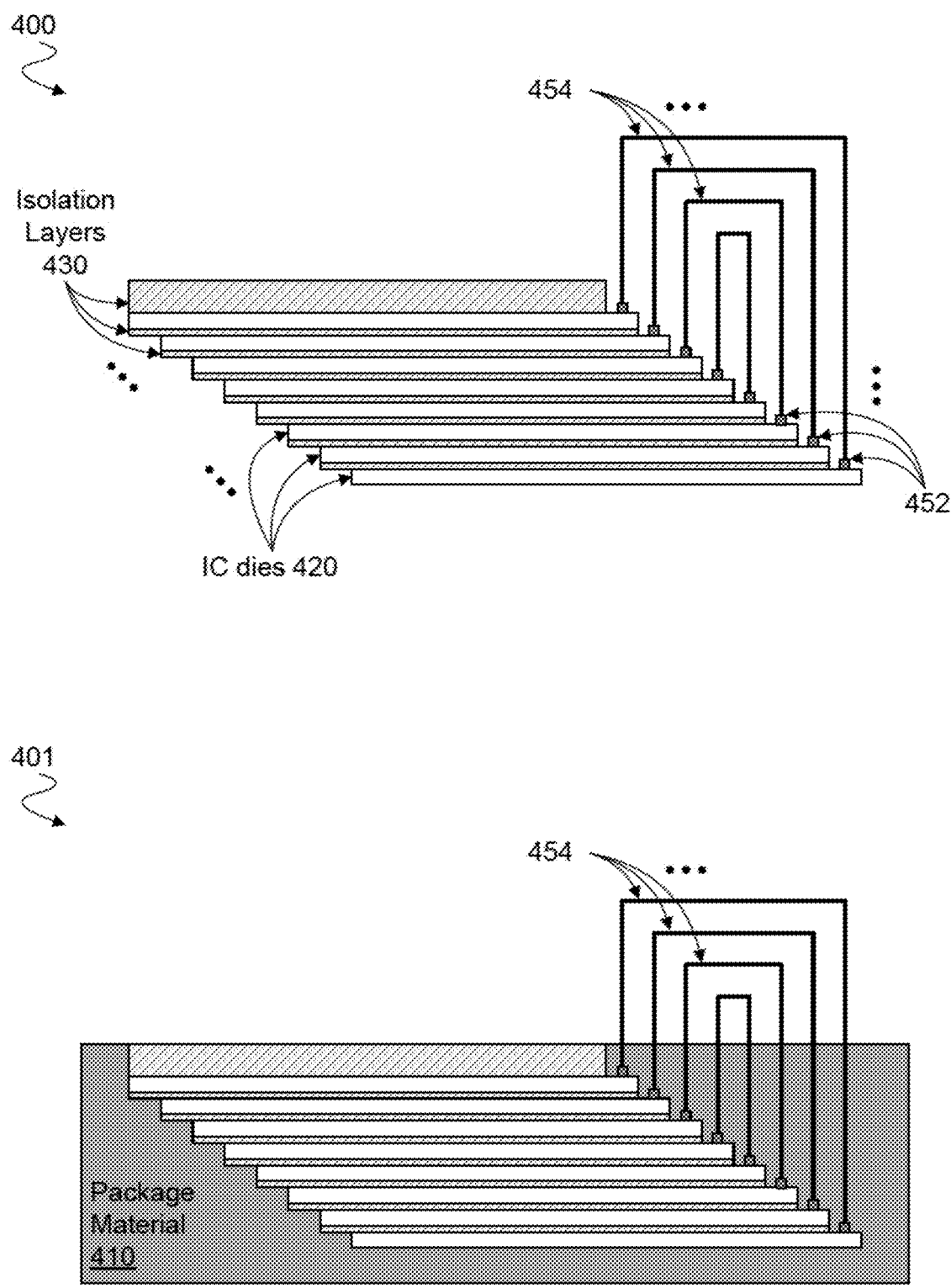
FIGS. 4A, 4B show cross-sectional diagrams variously illustrating operations to fabricate interconnect structures of a packaged device according to an embodiment.
Figure 4B:
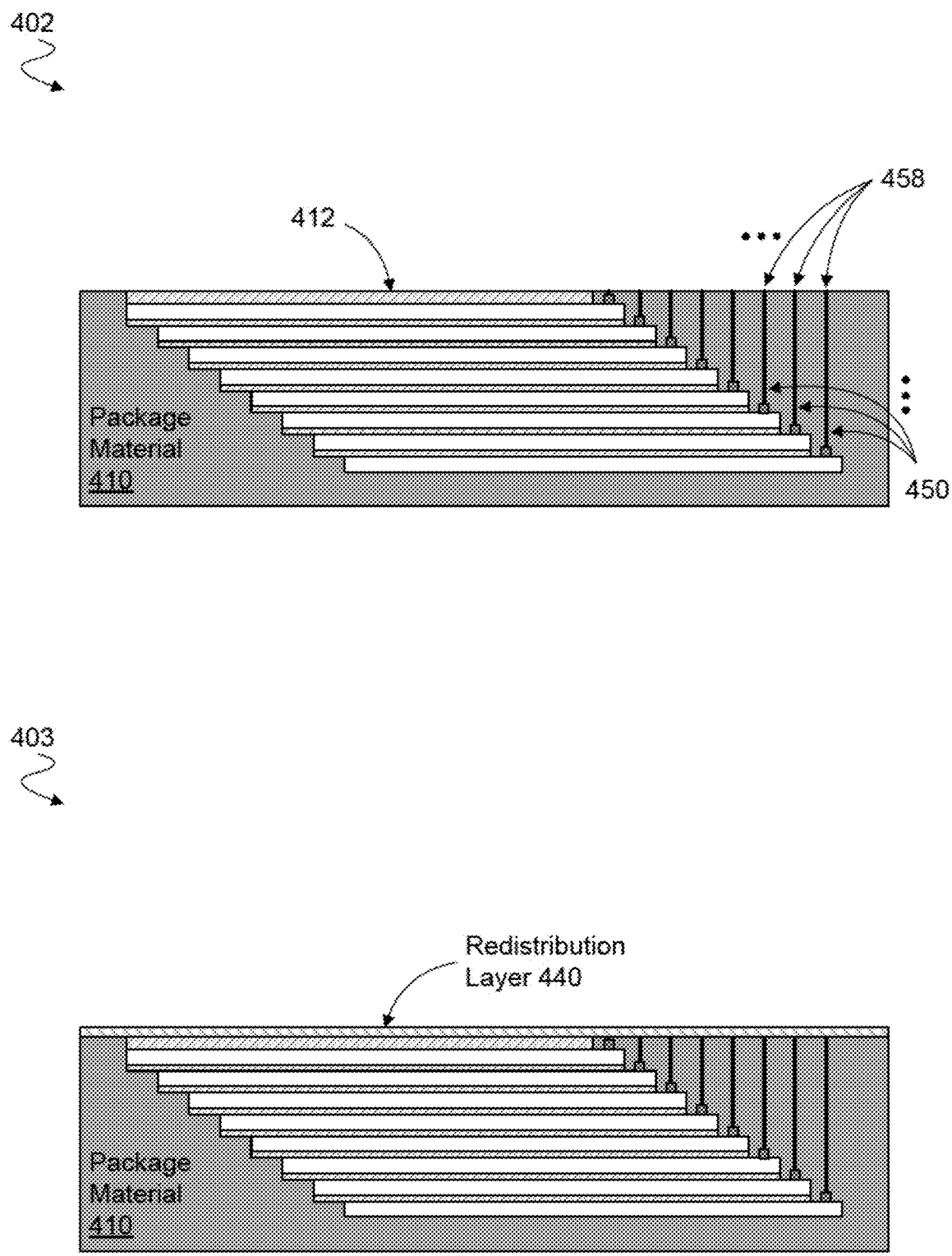

FIGS. 4A, 4B show cross-sectional views illustrating respective stages 400-403 of processing to fabricate a packaged IC device according to an embodiment. Processing such as that shown in FIG. 4A, 4B may include some or all of the features of method 200, for example. In one illustrative embodiment, such processing fabricates hardware having features of device 100.

At stage 400, a stack including overlapping IC dies 420 is formed. The stack may further comprise isolation layers 430 (or other such isolation structures) variously disposed between respective ones of IC dies 420. Exposed surface portions of IC dies 420 may have formed therein or thereon interface hardware, such as the illustrative contact pads 452, to facilitate interconnection of IC dies 420 with one another. A plurality of wires 454 may be variously coupled each to a respective one of IC dies 420 via a respective one of contacts 452. By way of illustration and not limitation, wires 454 may each comprise respective opposite ends that are each to couple to a different respective one of contacts 452. In such an embodiment, the stack comprising IC dies 420 may omit a layer of dummy material such as that of dummy layer 340. Instead, different IC dies 420 may provide two distinct anchor points to keep a given one of wires 454 in place during subsequent fabrication processing. Such subsequent processing may include, at stage 401, a package material 410 being disposed at least around IC dies 420 and respective portions of wires 454 that are coupled to contacts 452. During the injection molding or other such depositing of package material 410, the anchoring of wires 454, each to multiple points on IC dies 410, may aid in providing mechanical support to resist movement that might otherwise displace and/or deform wires 454.

At stage 402, portions of wires 454 may be removed to form other wire portions 450 each extending from a respective one of contacts 450 to an exposed surface of package material 410. By way of illustration and not limitation, cutting, grinding, polishing and/or other processing may be performed to remove portions of wires 454 that extend above package material 410. Such processing may also remove some of package material 410—e.g., to expose a surface of package material 410 that extends in a plane 412 (seen edgewise in FIG. 4B). Exposed ends 458 of portions 450 may also be in plane 412, for example. At stage 403, a redistribution layer 440 may adhered or otherwise coupled to exposed structures in plane 412—e.g., including coupling redistribution layer 440 to exposed ends 458 of portions 450. After such coupling, redistribution layer 440 may interconnect various ones of ends 458 to one another, which in turn may provide for various interconnections between IC dies 420. Additional processing (not shown) may include disposing solder bumps and/or other interface hardware on redistribution layer 440.

Figure 5:
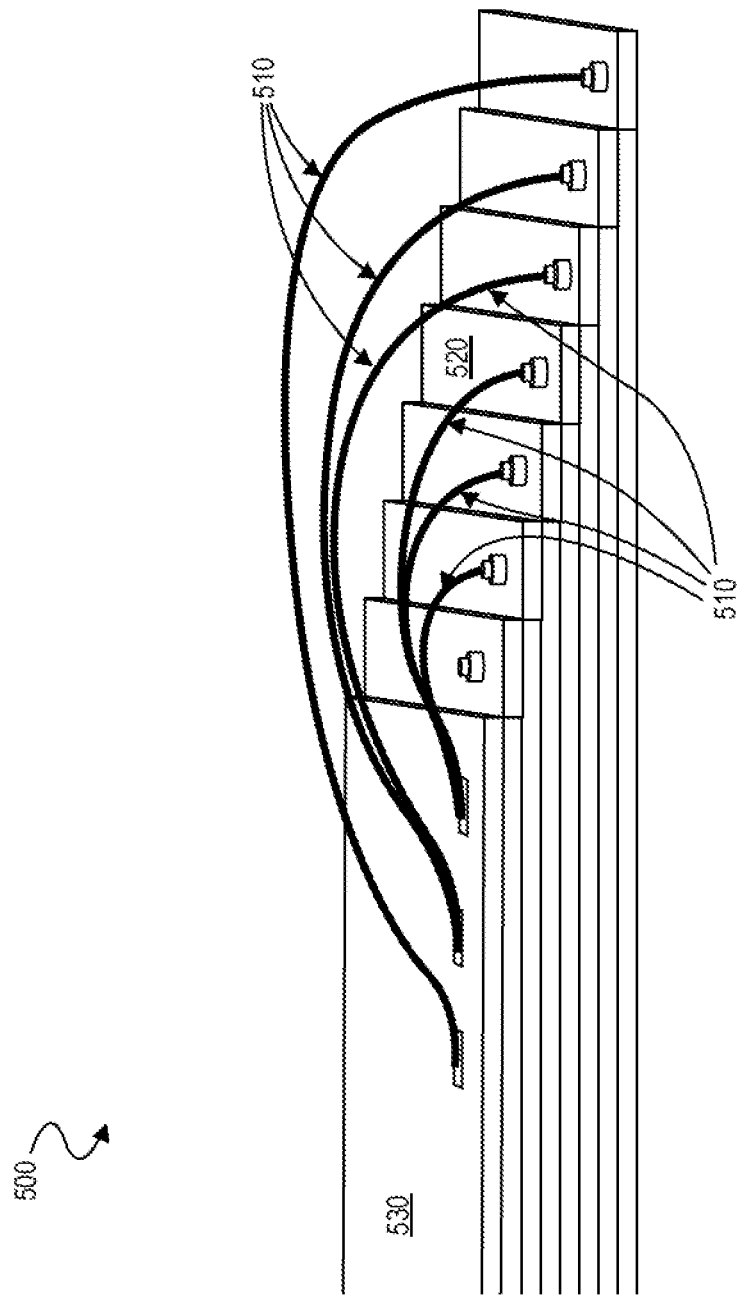
FIG. 5 is a microscopic image illustrating elements of an integrated circuit die assembly according to an embodiment.

FIG. 5 is a microscope image 500 of an assembly during fabrication processing, according to an embodiment, to provide interconnection of IC dies. The assembly 500 may include structures such as those represented in FIG. 3A by stage 301, for example. In an embodiment, assembly 500 is formed during method 200—e.g., after the coupling at 220 and the anchoring at 230. As shown in image 500, the assembly includes IC dies 520 arranged in a stack configuration, a dummy layer 530 stacked with the IC dies 520, and wires 510 coupled variously each both to dummy layer 530 and to a respective one of IC dies 520. As shown in image 500, wires 510 may be variously bent—e.g., where portions of such wires 510 variously extend from respective surfaces of IC dies 520, each in a direction that is substantially perpendicular to such surfaces. Such wire portions may be subsequently surrounded by a packaging material (not shown) that is to be disposed around IC dies 520 and, in some embodiments, at least partially around dummy layer 530. In an embodiment, respective portions of wires 510 that extend above IC dies 520 (and above the package material, for example) may be separated from other portions of wires 510 that are disposed in such package material. Subsequently, the portions of wires 510 that are within such package material may be coupled to one another via a redistribution layer (not shown).

Figure 6:
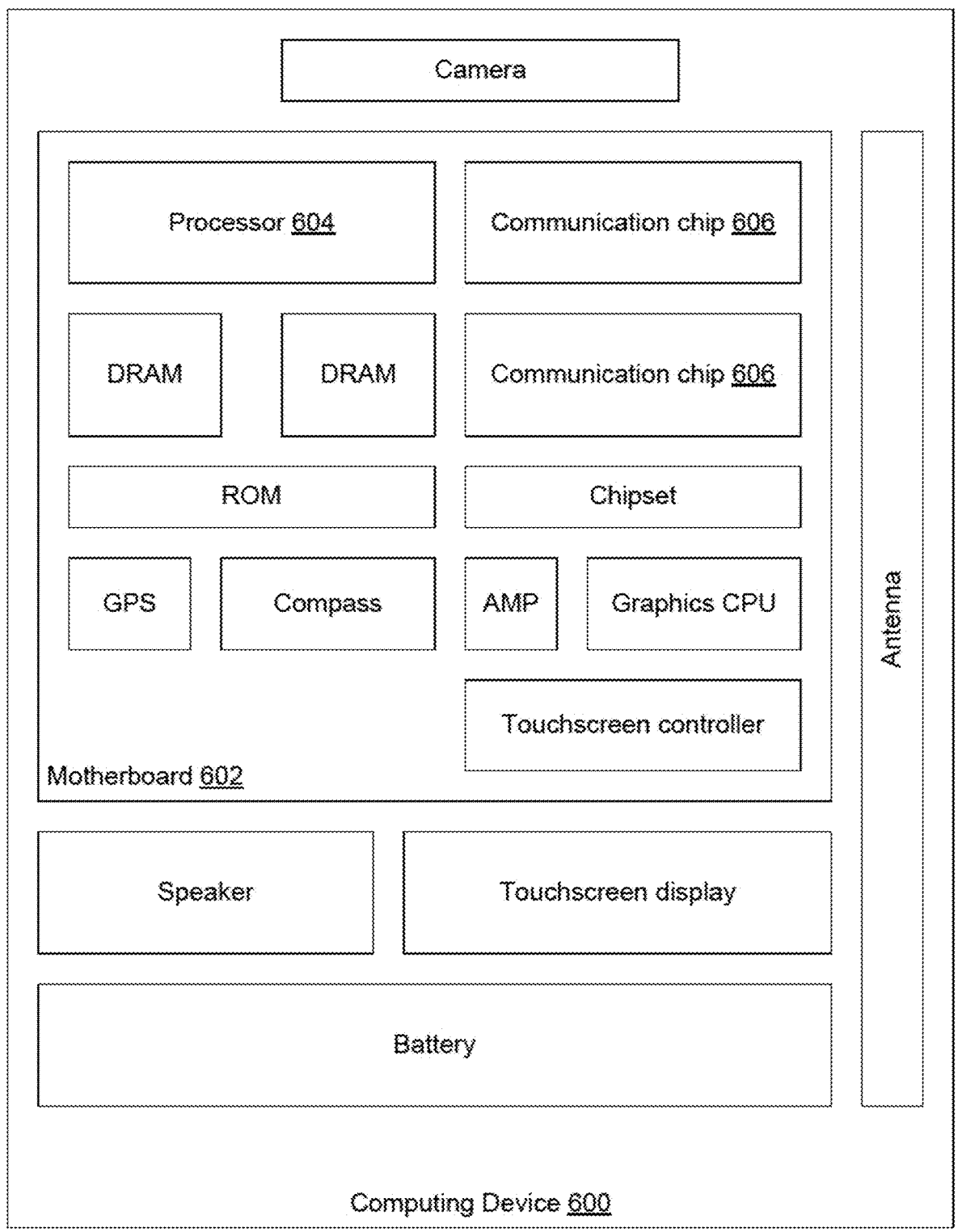
FIG. 6 illustrates a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), solid state drive (SSD) and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be provided as a computer program product, or software, that may include a machine-readable medium having stored thereon instructions, which may be used to program a computer system (or other electronic devices) to perform a process according to some embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
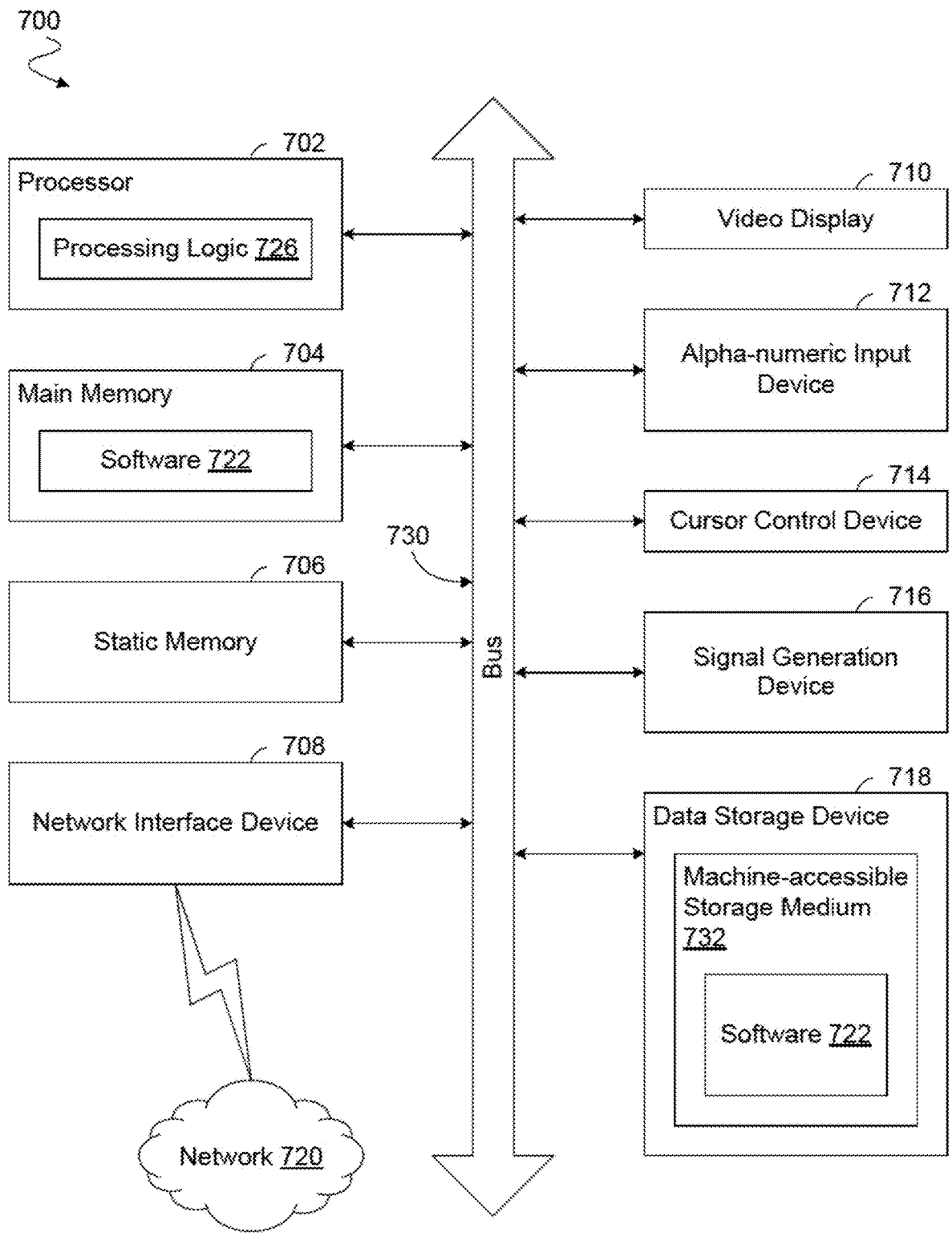
FIG. 7 illustrates a block diagram of an exemplary computer system, in accordance with an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of an embodiment. The term "machine-readable storage medium" shall accordingly be taken to include, but not be limited to, solid-state memories, and optical and magnetic media.

Figure 8:
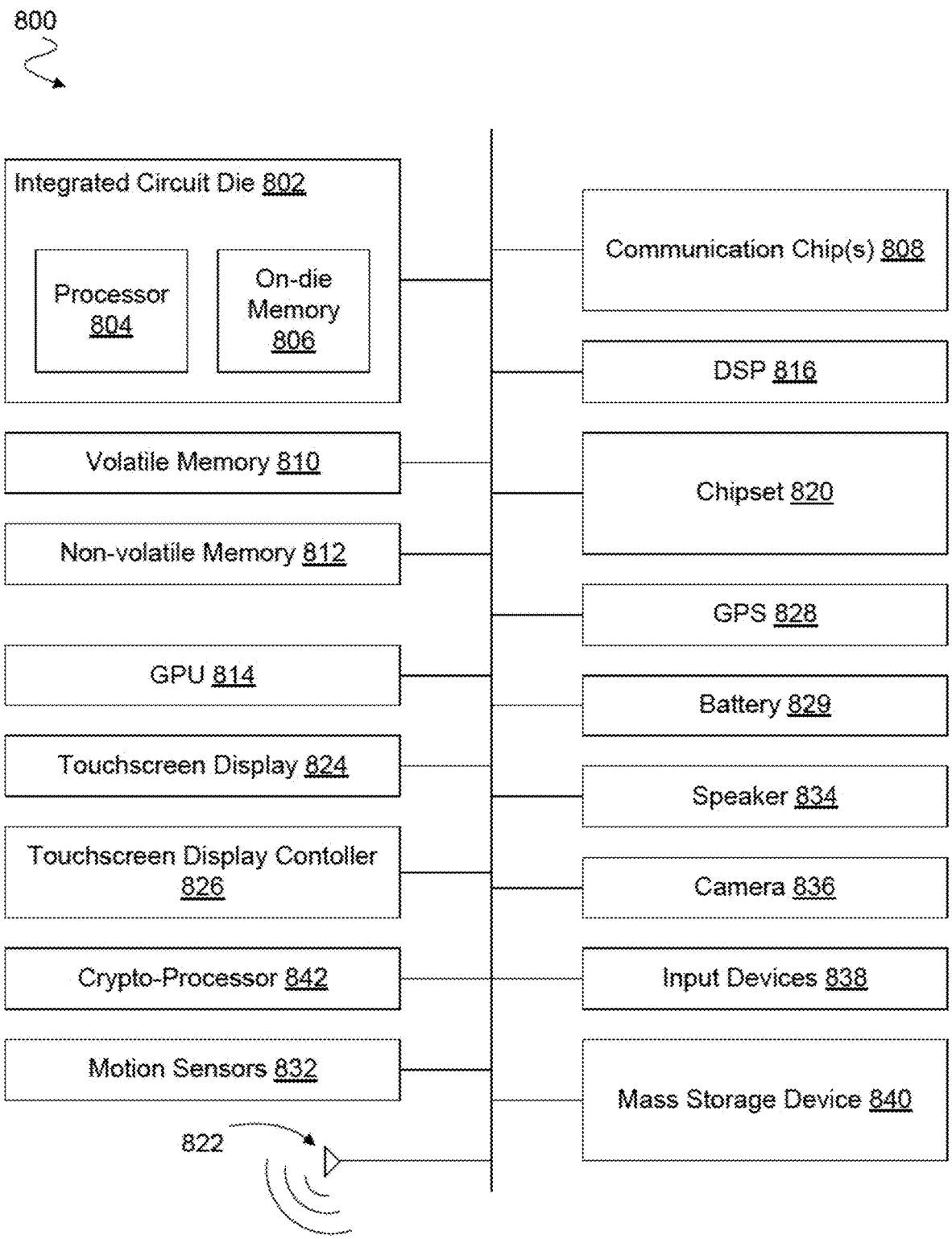
FIG. 8 is a computing device built in accordance with an embodiment.

FIG. 8 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 829 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In one implementation, a method comprises forming a stack comprising multiple integrated circuit (IC) dies including a first IC die and a second IC die, coupling to the first IC die a first end of a first wire, anchoring a second end of the first wire to the stack, wherein the first wire comprises the second end and a first portion including the first end, and while the first end is coupled to the IC die and the second end is anchored to the stack, disposing a package material around the multiple IC dies and the first portion. The method further comprises, after disposing the package material around the multiple IC die, separating the second end from the first portion, including exposing another end of the first portion at a first surface of the package material, and coupling the first IC die to the second IC die, including forming a redistribution layer on the first surface, wherein the redistribution layer is coupled to the second IC die and to the other end of the first portion.

In an embodiment, the stack further comprises a dummy layer, and wherein anchoring the second end includes coupling the second end to the dummy stack. In another embodiment, the dummy layer comprises aluminum. In another embodiment, anchoring the second end includes coupling the second end to one of the multiple IC dies. In another embodiment, after the separating, the first portion extends along a straight line from the first IC die to the redistribution layer. In another embodiment, after the separating, the first portion extends from a surface of the first IC die through the package material in a direction that is perpendicular to the surface of the first IC die. In another embodiment, separating the second end from the first portion includes thinning the package material. In another embodiment, after disposing the package material around the multiple IC dies and the first portion, the first wire extends at least partially outside of the package material.

In another embodiment, forming the stack includes arranging a staggered configuration of the multiple IC dies. In another embodiment, coupling the first end to the first IC die includes coupling multiple wires each to a respective one of contact pads disposed on a surface of the first IC die, wherein the contact pads are arranged in a row along an edge of the first IC die. In another embodiment, the separating the second end from the first portion includes thinning the package material to expose a surface of the package material that extends in a plane, wherein a first material, other than the package material, is disposed between the second IC die and the plane, wherein a surface of the first material extends in the plane and wherein the package material is disposed between the first portion and the first material in the plane. In another embodiment, the first material includes a residual adhesive or a residual dummy material. In another embodiment, the first wire is rigid or semi-rigid and wherein, before the first end is coupled to the first IC die, the first wire is formed in an arch.

In another implementation, a device comprises a stack including multiple integrated circuit (IC) dies comprising a first IC die and a second IC die, a package material disposed around the multiple IC dies, wherein a surface of the package material extends in a plane, and a redistribution layer coupled to the surface of the package material, wherein, of the multiple IC dies, the second IC die is closest to the redistribution layer. The device further comprises a first wire coupled to the first IC die and to the redistribution layer, the first wire extending through the package material from a contact on the first IC die to the redistribution layer, wherein the first IC die is coupled to another IC die of the multiple IC dies via the redistribution layer and the first wire, and a first material, other than the package material, disposed between the second IC die and the plane, wherein a surface of the first material extends in the plane and wherein the package material is disposed between the first portion and the first material in the plane.

In an embodiment, the first material includes a residual adhesive or a residual dummy material. In another embodiment, the residual dummy material includes aluminum. In another embodiment, the first portion extends along a straight line from the first IC die to the redistribution layer. In another embodiment, the first portion extends from a surface of the first IC die through the package material in a direction that is perpendicular to the surface of the first IC die. In another embodiment, the multiple IC dies are arranged in a staggered configuration. In another embodiment, the device comprises a first plurality of wires, including the first wire, each coupled to a respective one of contact pads disposed on a surface of the first IC die, wherein the contact pads are arranged in a row along an edge of the first IC die. In another embodiment, the first end forms a spherical section of the first wire.

In another implementation, a system comprises a packaged device including a stack including multiple integrated circuit (IC) dies comprising a first IC die and a second IC die. The packaged device further comprises a package material disposed around the multiple IC dies, wherein a surface of the package material extends in a plane, a redistribution layer coupled to the surface of the package material, wherein, of the multiple IC dies, the second IC die is closest to the redistribution layer, and a first wire coupled to the first IC die and to the redistribution layer, the first wire extending through the package material from a contact on the first IC die to the redistribution layer, wherein the first IC die is coupled to another IC die of the multiple IC dies via the redistribution layer and the first wire. The packaged device further comprises a first material, other than the package material, disposed between the second IC die and the plane, wherein a surface of the first material extends in the plane and wherein the package material is disposed between the first portion and the first material in the plane. The system further comprises a display device coupled to the packaged device, the display device to display an image based on signals exchanged with the packaged device.

In an embodiment, the first material includes a residual adhesive or a residual dummy material. In an embodiment, the residual dummy material includes aluminum. In an embodiment, the first portion extends along a straight line from the first IC die to the redistribution layer. In an embodiment, the first portion extends from a surface of the first IC die through the package material in a direction that is perpendicular to the surface of the first IC die. In an embodiment, the multiple IC dies are arranged in a staggered configuration. In an embodiment, the packaged device comprises a first plurality of wires, including the first wire, each coupled to a respective one of contact pads disposed on a surface of the first IC die, wherein the contact pads are arranged in a row along an edge of the first IC die. In an embodiment, the first end forms a spherical section of the first wire. Techniques and architectures for providing a packaged integrated circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device, comprising:
   a stack of dies in a stair-step arrangement, the stack of dies comprising a first die over a second die, the second die over a third die;
   a package material laterally adjacent to and encapsulating the stack of dies;
   a redistribution layer over the package material and over the stack of dies;
   a first plurality of wires coupling the first die to the redistribution layer, the first plurality of wires in the package material and having a first height, and the first plurality of wires coupled to a side of the first die facing the redistribution layer;
   a second plurality of wires coupling the second die to the redistribution layer, the second plurality of wires in the package material and having a second height greater than the first height, and the second plurality of wires coupled to a side of the second die facing the redistribution layer;
   a third plurality of wires coupling the third die to the redistribution layer, the third plurality of wires in the package material and having a third height greater than the second height, and the third plurality of wires coupled to a side of the third die facing the redistribution layer; and
   a plurality of solder balls on the redistribution layer.

2. The device of claim 1, wherein the package material is further beneath the stack of dies.

3. The device of claim 1, further comprising:
   a material layer between the stack of dies and the redistribution layer.

4. The device of claim 3, wherein the material layer includes a residual adhesive or a residual dummy material.

5. The device of claim 4, wherein the residual dummy material includes aluminum.

6. The device of claim 1, further comprising:
   a first isolation material layer between the first die and the second die; and
   a second isolation material layer between the second die and the third die.

7. The device of claim 1, wherein the package material comprises an epoxy.

8. The device of claim 1, wherein the package material comprises a resin.

9. The device of claim 1, wherein the package material comprises a plastic.

10. The device of claim 1, wherein the package material comprises a ceramic.

11. A device, comprising:
    a stack of three or more dies in a stair-step arrangement;
    a package material laterally adjacent to and encapsulating the stack of three or more dies;
    a redistribution layer over the package material and over the stack of three more dies;
    a plurality of wires comprising individual wires coupling corresponding ones of the three or more dies to the redistribution layer, the plurality of wires in the package material, and the plurality of wires coupled to respective sides of the three or more dies facing the redistribution layer; and
    a plurality of solder balls on the redistribution layer.

12. The device of claim 11, wherein the package material is further beneath the stack of three or more dies.

13. The device of claim 11, further comprising:
    a material layer between the stack of three or more dies and the redistribution layer.

14. The device of claim 13, wherein the material layer includes a residual adhesive or a residual dummy material.

15. The device of claim 14, wherein the residual dummy material includes aluminum.

16. The device of claim 11, further comprising:
an isolation material between adjacent dies of the stack of three or more dies.

17. The device of claim 11, wherein the package material comprises an epoxy.

18. The device of claim 11, wherein the package material comprises a resin.

19. The device of claim 11, wherein the package material comprises a plastic.

20. The device of claim 11, wherein the package material comprises a ceramic.

21. A device, comprising:
a stack of dies in a stair-step arrangement, the stack of dies comprising a first die over a second die, the second die over a third die;
a package material laterally adjacent to and encapsulating the stack of dies;
a redistribution layer over the package material and over the stack of dies;
a first plurality of wires coupling the first die to the redistribution layer, the first plurality of wires in the package material and having a first height;
a second plurality of wires coupling the second die to the redistribution layer, the second plurality of wires in the package material and having a second height greater than the first height;
a third plurality of wires coupling the third die to the redistribution layer, the third plurality of wires in the package material and having a third height greater than the second height;
a plurality of solder balls on the redistribution layer; and
a material layer between the stack of dies and the redistribution layer, wherein the material layer includes a residual adhesive or a residual dummy material, and wherein the residual dummy material includes aluminum.

22. A device, comprising:
a stack of three or more dies in a stair-step arrangement;
a package material laterally adjacent to and encapsulating the stack of three or more dies;
a redistribution layer over the package material and over the stack of three more dies;
a plurality of wires comprising individual wires coupling corresponding ones of the three or more dies to the redistribution layer, the plurality of wires in the package material;
a plurality of solder balls on the redistribution layer; and
a material layer between the stack of three or more dies and the redistribution layer, wherein the material layer includes a residual adhesive or a residual dummy material, and wherein the residual dummy material includes aluminum.

* * * * *